INVENTORS
RALPH D. KNOTT
GERALD D. BERGMAN
BY
Frank R. Trifari
AGENT

INVENTORS
RALPH D. KNOTT
GERALD D. BERGMAN
BY
Frank R. Trifari
AGENT

United States Patent Office 3,443,171
Patented May 6, 1969

3,443,171 SYMMETRICAL SWITCHING CONTROLLED RECTIFIER WITH NON-OVERLAPPED EMITTERS

Ralph David Knott, Greenford, and Gerald David Bergman, Bushey Heath, England, assignors to North American Philips Company, Inc., New York, N.Y., a corporation of Delaware Continuation of application Ser. No. 566,641, July 20, 1966. This application June 3, 1968, Ser. No. 739,925
Claims priority, application Great Britain, July 23, 1965, 31,445/65
Int. Cl. H01l 5/02
U.S. Cl. 317—234 4 Claims

ABSTRACT OF THE DISCLOSURE

A four-junction bilateral switching device employing two shorted emitters obtained by metallic contacts which overlap and short-circuit the emitter-base junctions at opposite sides of the device. The opposed emitters are laterally spaced from one another such a distance that the charge carriers during conduction along one side of the device do not substantially leak into the adjacent side of the device, which could reduce the ability of the device to withstand applied reverse voltages.

This application is a continuation of a prior copending application Ser. No. 566,641, filed July 20, 1966, now abandoned.

This invention relates to multilayer semiconductor devices having two emitter junctions, which are shorted at a line of contact with the semiconductor body, and symmetrical switching characteristics. In such devices, which are described in J. App. Phys. 30 (1959), 1819, current flow in each direction passes from an emitter junction to a collector electrode and the device may conduct in each direction depending on the polarity of the applied voltage and the voltage applied to gate regions intermediate the emitter junctions and collector electrodes. Multilayer devices to which this invention relates have five or more layers, the layers in excess of five may form gate junctions. In gated switching devices, to which this invention also relates, conduction is initiated by injection of carriers from a gate region and devices of this type are described in Solid State Design, September 1964, at p. 25 et. seq. A gate serves only to initiate current flow by injection of charge carriers and cause commutation of the device. The two electrodes to the device between which current flows are termed the anode and cathode of the device depending upon the conducting polarity of the device. The term "symmetrical switching" indicates that the device has switching properties in the first and third quadrants of the characteristic and the electrodes which act as anode and cathode in one quadrant act as cathode and anode respectively in the other quadrant or commutation.

In such devices a disadvantage in operation is the low voltage at which the device will commutate if the applied voltage is reversed rapidly so that the rate of rise of reverse current is also rapid. In extreme cases the rate of rise of reverse current may be so rapid that the device fails to block the applied reverse voltage. This disadvantage is mitigated to some extent in the device according to the invention.

According to the invention in a multilayer semiconductor symmetrical switching device the projections of the emitter regions upon a plane normal to the direction of the current flow through the device do not overlap and are separated by a distance. The current flow through the device may be normal to the PN junctions defining the central layer. The distance may be 100 micron or greater or 500 micron or greater.

Figures 1, 2, 3:
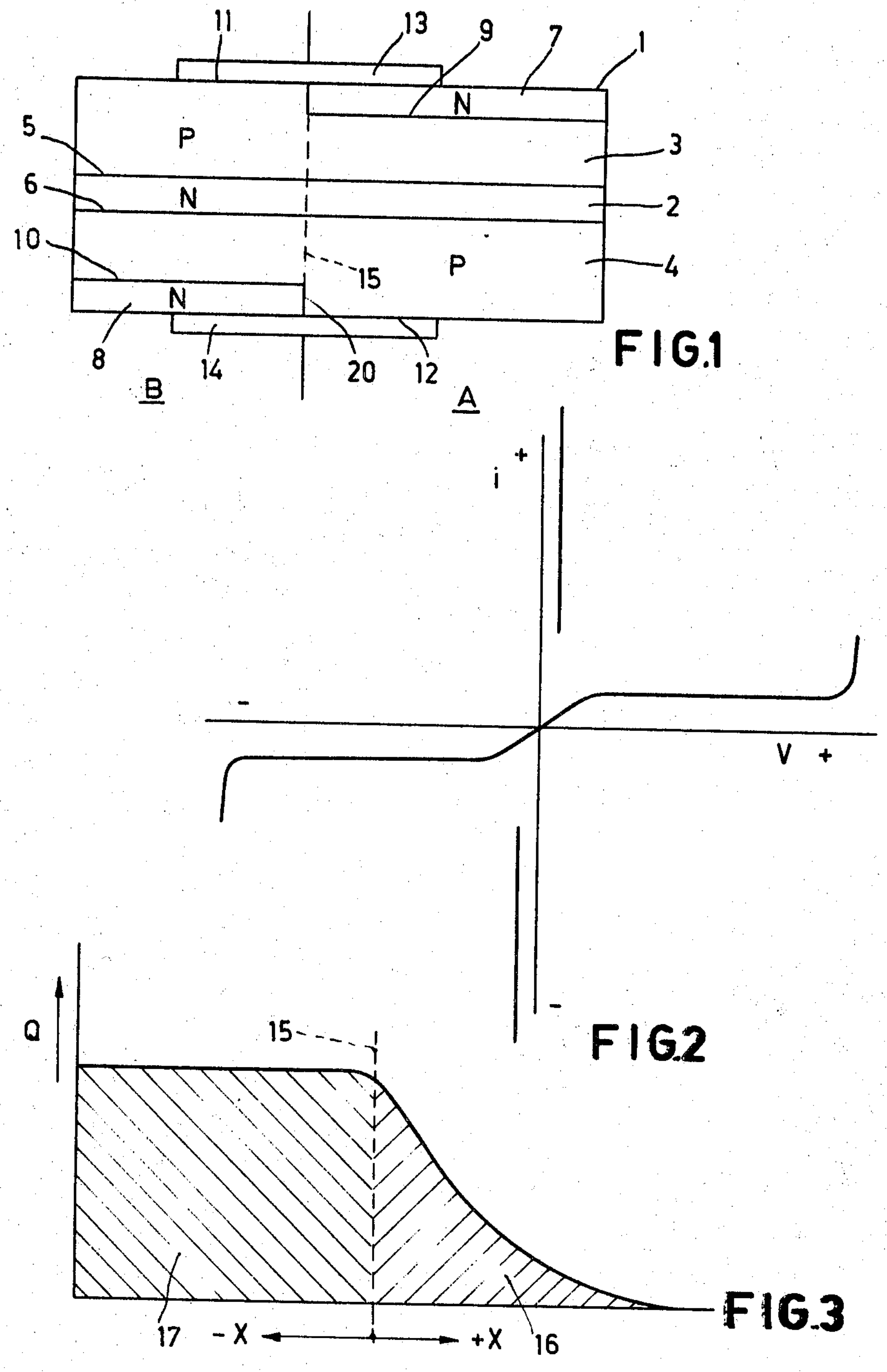
Figure 4:
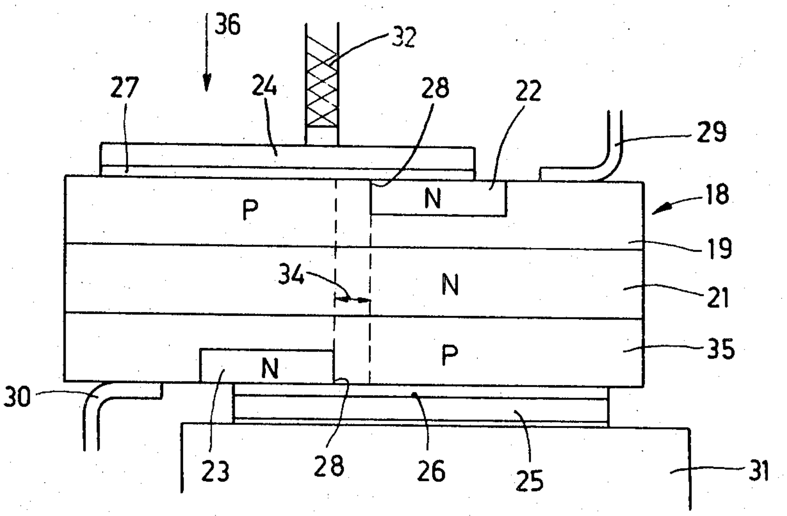
Figure 5:
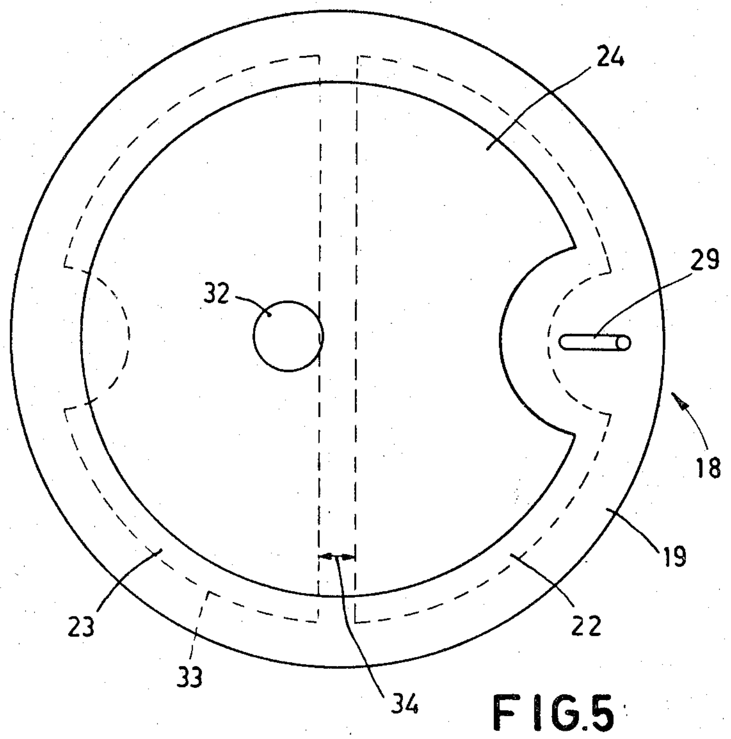

One embodiment of the device according to the invention will now be described by way of example with reference to the accompanying diagrammatic drawings in which:

FIGURE 1 shows a cross sectional view of a known five layer two electrode switching device, FIGURE 2 shows the characteristic of the device of FIGURE 1, FIGURE 3 shows the charge distribution in the device of FIGURE 1 in operation, FIGURE 4 shows a vertical section of a five layer four electrode switching device according to the invention and FIGURE 5 shows a surface view of the device of FIGURE 4.

In FIGURE 1 the two electrode devices comprises a monocrystalline silicon body, having five contiguous layers arranged in alternate conductivity type. A central N-type layer 2 lies between and is contiguous with the first and second P-type regions 3, 4, forming PN junctions 5, 6 therewith. First and second emitter regions 7, 8 of N-type conductivity are adjacent to and contiguous with the P-type regions 3, 4 and form first and second emitter PN junctions 9, 10 with the P-type regions. For convenience in description the device may be regarded as consisting of two sections A, B, separated by the chain line 15 parallel to the current flow in each section and joining the points where the emitter junctions 3, 10 are shorted by electrode layers 13, 14.

Two opposed external surfaces 11, 12 of the body are formed by the coplanar external surfaces of adjacent emitter and P-type regions. Electrode layers 13, 14 are formed on the opposed external surfaces 11, 12 respectively and make ohmic contact to adjacent emitter and P-type regions, overlying and short circuiting the corresponding emitter junctions. Electrical contact is made to the electrode layers to allow electrical signals to be applied to the device.

The device is a symmetrical switch and its characteristic of current against voltage is shown in FIGURE 2. The device can conduct in the 1st or 3rd quadrant and may be switched between the quadrants by reversing the applied voltage.

As is seen from FIGURE 3 there is a region 16 of charge concentration extending beyond the current path 17 between the emitter junction and the collector contact. This current path is delineated by the chain line 15. The concentration of charge in the current path 17 is substantially constant and decreases with a logarithmic function outside the path in the non-conducting section of the device. If the applied voltage is such that the device is conducting in section A, that is to say by emission of charge carriers from the first emitter junction 9 and collection at the second electrode layer 14 a certain concentration of charge carriers exists beyond the chain line 15 in section B between the second emitter junction 10 and the first electrode layer 13. When section A is conducting there is a current flow parallel to a portion 20 of the second emitter junction 10 and produces a forward bias voltage at the emitter junction. When the device is commutated rapidly between the 1st and 3rd quadrants it is possible for the second emitter junction to fail to establish its blocking voltage and section B of the device will conduct.

The switching characteristics of the device may be improved in the device according to the invention, In this device the charge concentration has a high value outside the current path but this volume of charge concentration 16 does not extend or extends only to a small amount into the current path of the other section of the device which conducts in the other quadrant.

*Example*

Referring now to FIGURE 4 in which a five layer device having two gate contacts according to the invention is shown. A monocrystalline N-type silicon disc-shaped body 18 having a thickness of 155$\mu$, a diameter of 14 mm. and a resistivity of 35 ohm cm. was diffused with gallium to a depth of 40$\mu$ in each of its two opposed external surfaces to give a surface concentration of $2\times10^{18}$ atoms $cc.^{-1}$. The gallium diffusion process formed P-type intermediate regions 19, 35 contiguous with a central N-type layer 21 which had a thickness of 75$\mu$. N-type emitter regions 22, 23 having a depth of 14$\mu$ and a surface concentration of $10^{21}$ atoms $cc.^{-1}$ were then formed by diffusion of phosphorus through windows opened in an oxide mask using photolithographic techniques. Nickel plated molybdenum discs 24, 25 having a thickness of 250$\mu$ were then soldered on the opposed external surfaces of the body 18 by means of solder layers 27, 26 consisting of lead/nickel (0.1%) alloy. The discs 24, 25 made ohmic contact to adjacent N-type emitter regions and P-type intermediate regions and formed a short circuit across the emitter junctions at the lines of contact of these junctions with the opposed external surfaces, the lines of contact are indicated by points 28 in FIGURE 4. Aluminum gate contacts 29, 30 were attached to the intermediate P-type regions 19, 35 using ultrasonic welding techniques.

The disc 25 of the device was then mounted on a copper base 31 by means of tin solder and a flexible copper lead 32 soldered to the disc 24. Encapsulation of the device was such as to allow the application of switching voltages to the gate contacts 29, 30.

In FIGURE 5 there is shown a view in the direction indicated by arrow 36 of a surface of the body 18 prior to encapsulation. The P-type intermediate region 19 has the aluminum gate contact 29 welded to its exposed surface and disc 24 makes ohmic contact to the region 19 and the N-type emitter region 22. The flexible copper lead 32 makes electrical contact to disc 24 and the projection of the emitter region 23 upon a plane normal to the direction of current flow is indicated by chain line 33. The arrow 36 is parallel to the direction of current flow in this device. The separation distance 34 between the projections of the emitter regions is approximately 1 mm.

A semiconductor symmetrical switching device having a multilayer structure comprises a central layer 21 of one conductivity type contiguous with intermediate regions 19, 35 of the other conductivity type having contiguous emitter regions 22, 23 of the one conductivity type defining emitter junctions which are shorted at lines of contact 28 with the semiconductor body surface. The projections of the emitter regions upon a plane normal to the direction of current flow through the device do not overlap and are separated by a distance 34.

Gate contacts 29, 30 may be made to the intermediate regions 19, 35, which contacts may make ohmic contact to gate regions of the one conductivity type.

If gates are not present the switching action is obtained by the flow of current along the emitter PN junction. This current flow gives a voltage drop along the unction which biases a part of the junction so that carrier emission occurs.

When conduction is taking place in, for example, the 1st quadrant charge will be stored in the device. If the current is reduced rapidly to zero, and an attempt is made to bias the device into the 3rd quadrant some current will flow because of the stored charge. If this current is large it can cause the device to switch on in the 3rd quadrant; that is fail to commutate. More precisely a limit will be set to the permissible $dI/dt$ of the current due to the stored charge.

With a device prepared as described in the example, it was found that the reverse voltage was blocked on commutation when the rate of change of reverse current was at least 20 a./$\mu$sec., this value being the limit of the test equipment. A second device was prepared according to the example but having no distance between the projection of the emitter regions, that is to say with an emitter region configuration similar to that shown in FIGURE 1. This second device failed to block the reverse voltage when the rate of change of reverse current was 3 *a.*/$\mu$sec. or higher. Thus it is seen that the invention provides a switching device having improved switching characteristics.

It will be appreciated that the diffusion profile of the emitter regions 22, 23 will not normally be of the form shown, that is to say when diffusion techniques are used, the extension of the diffusion profile under the masking oxide layer is less at the surface of the body than at a distance into the body.

Although the invention is limited to a device having an emitter junction shorted at a line of contact with the semiconductor body surface, it extends to a switching device in which the emitter regions and central layer are of P-type material and the intermediate regions are of N-type material.

What is claimed is:

1. A symmetrical switching device comprising a common semiconductor body having at least three laterally extending semiconductive regions of alternating conductivity type with the outer regions of one conductivity type and the inner region of the opposite conductivity type and having a generally centrally-located axis extending perpendicularly to the lateral regions, a first emitter region of said opposite conductivity type within one of the outer regions forming a first p-n junction extending to a first surface of said body, means for interconnecting said one outer region and said first emitter and comprising a metallic element conductively contacting said first body surface at said one outer region and said first emitter and overlapping and contacting said first p-n junction, a second emitter region of said opposite conductivity type within the other outer region forming a second p-n junction extending to a second surface of said body, means for interconnecting said other outer region and said second emitter and comprising a metallic element conductively contacting said second body surface at said other outer region and said second emitter and overlapping and contacting said second p-n junction, said first and second emitter regions being located on opopsite sides of the axis in non-overlapping relationship to define through the body two current paths substantially parallel to said axis each including one of said emitter regions, the flow of charge carriers along one of said current paths establishing a decreasing charge concentration in the direction toward the adjacent current path, said first and second emitter regions being laterally spaced from one another such a large distance that the charge concentration due to carrier flow in one of said current paths does not substantially extend into the adjacent current path.

2. A symmetrical switching device as set forth in claim 1 wherein the interconnecting means each comprise a metallic element soldered across the associated p-n junction.

3. A switching device as set forth in claim 2 wherein connection means are applied to each of the outer regions.

4. A switching device as set forth in claim 1 wherein the lateral spacing between the emitter regions exceeds 500 microns.

References Cited

UNITED STATES PATENTS

| | | | |
|---|---|---|---|
| 3,123,750 | 3/1964 | Hutson et al. | 317—235 |
| 3,317,746 | 5/1967 | Hutson | 317—235 |

JOHN W. HUCKERT, *Primary Examiner.*

JERRY D. CRAIG, *Assistant Examiner.*

U.S. Cl. X.R.

317—235